(12) United States Patent
 Hsieh et al.

(10) Patent No.: US 11,233,195 B2
(45) Date of Patent: Jan. 25, 2022

(54) MEMORY DEVICES AND METHODS OF FORMING MEMORY DEVICES

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Yi Jiang, Singapore (SG); Kai Kang, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 64 days.

(21) Appl. No.: 16/893,578

(22) Filed: Jun. 5, 2020

(65) Prior Publication Data

US 2021/0384420 A1 Dec. 9, 2021

(51) Int. Cl.
 *H01L 45/00* (2006.01)

(52) U.S. Cl.
 CPC .......... *H01L 45/08* (2013.01); *H01L 45/1233* (2013.01); *H01L 45/1608* (2013.01)

(58) Field of Classification Search
 CPC ...................................................... H01L 45/00
 See application file for complete search history.

(56) References Cited

U.S. PATENT DOCUMENTS 10,439,134 B2 10/2019 Majhi et al.

*Primary Examiner* — Marvin Payen
(74) *Attorney, Agent, or Firm* — Viering Jentschura & Partner MBB

(57) ABSTRACT

A memory device may be provided, including a base layer; an insulating layer arranged over the base layer, where the insulating layer may include a recess having opposing side walls; a first electrode arranged along the opposing side walls of the recess; a switching element arranged along the first electrode; a second electrode arranged along the switching element; and a capping layer arranged over the recess, where the capping layer may at least partially overlap the first electrode, the switching element and the second electrode.

19 Claims, 14 Drawing Sheets

MEMORY DEVICES AND METHODS OF FORMING MEMORY DEVICES

TECHNICAL FIELD

The present disclosure relates generally to memory devices, and methods of forming the memory devices.

BACKGROUND

Non-volatile memory devices are often used in consumer electronic products such as smart phones and tablets. One type of non-volatile memory device is the resistive random access memory (RRAM) device. A RRAM device typically uses a switching element such as a dielectric element sandwiched between two electrodes. The switching element is normally insulating. However, upon application of a sufficiently high potential difference (set voltage/switching voltage) between the electrodes, conducting filaments may be formed within the switching element. The switching element thus becomes conductive via the conducting filaments. The switching element can be made insulating again by applying a sufficiently low voltage difference (reset voltage) to the electrodes to break the conducting filaments. A typical RRAM can switch between states based on the resistance of the switching element. When the switching element is insulating, the switching element has a high resistance, and the RRAM may be referred to as being in a high resistance state (HRS). When the switching element is conductive, the switching element has a low resistance and the RRAM may be referred to as being in a low resistance state (LRS). To set the RRAM, the RRAM is switched from the HRS to the LRS. To reset the RRAM, the RRAM is switched from the LRS to the HRS.

The fabrication of a memory device, such as a RRAM device, typically involves several processes that may possibly damage parts of the electrodes and the switching element. This may adversely affect the formation of the conducting filaments, and in turn, the performance of the memory device. For example, due to the damage caused during the fabrication process, the resistance of a RRAM device may vary greatly over different switching cycles. Accordingly, it is desirable to provide an improved memory device having reduced damage from manufacturing processes.

SUMMARY

According to various non-limiting embodiments, there may be provided a memory device including: a base layer; an insulating layer arranged over the base layer, where the insulating layer may include a recess having opposing side walls; a first electrode arranged along the opposing side walls of the recess; a switching element arranged along the first electrode; a second electrode arranged along the switching element; and a capping layer arranged over the recess, where the capping layer may at least partially overlap the first electrode, the switching element and the second electrode.

According to various non-limiting embodiments, there may be provided a method of forming a memory device. The method may include providing a base layer; forming an insulating layer over the base layer, where the insulating layer may include a recess having opposing side walls; forming a first electrode along the opposing side walls of the recess; forming a switching element along the first electrode; forming a second electrode along the switching element; and forming a capping layer over the recess, where the capping layer may at least partially overlap the first electrode, the switching element and the second electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1:
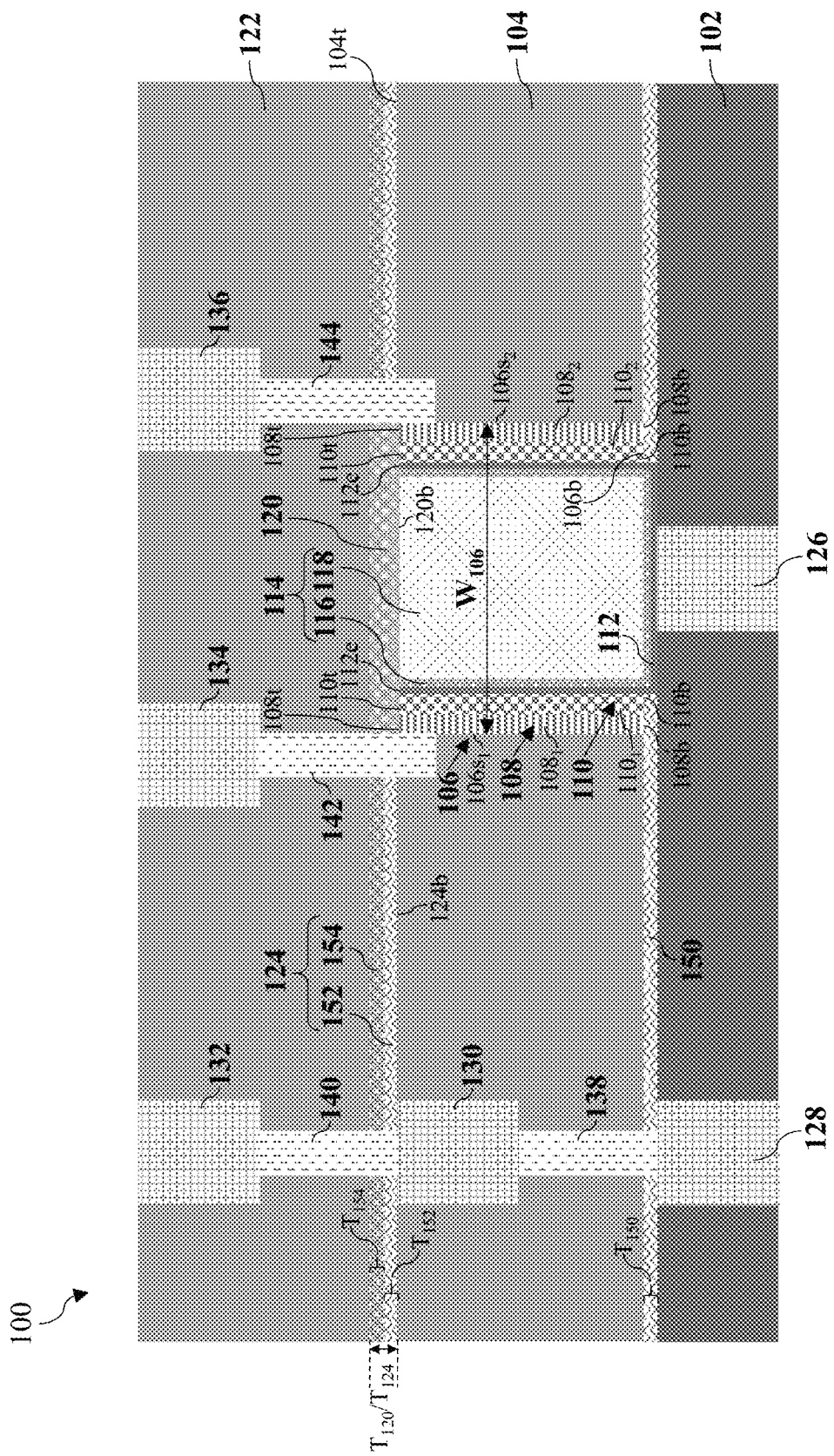
FIG. 1 shows a simplified cross-sectional view of a memory device according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory device 100 according to various non-limiting embodiments. The memory device 100 may include a RRAM device.

As shown in FIG. 1, the memory device 100 may include a base layer 102. The base layer 102 may be an inter-layer dielectric (ILD) layer and may include insulating material, such as, but not limited to, silicon oxide, silicon dioxide, silicon nitride, or combinations thereof.

The memory device 100 may further include an insulating layer 104 arranged over the base layer 102. The insulating layer 104 may also be an inter-layer dielectric (ILD) layer and may include insulating material, such as, but not limited to, silicon oxide, silicon dioxide, silicon nitride or combinations thereof. As shown in FIG. 1, the insulating layer 104 may include a top surface 104$t$ and a recess 106. The recess 106 may have a bottom surface 106$b$ and opposing side walls (including a first side wall 106$s_1$ and a second side wall 106$s_2$). The side walls 106$s_1$, 106$s_2$ may be vertical (in other words, may extend substantially perpendicular to the bottom surface 106$b$ of the recess 106) or may alternatively be slanted at an angle relative to the bottom surface 106$b$ of the recess 106.

A first blocking layer 150 may be arranged between the insulating layer 104 and the base layer 102. The first blocking layer 150 may include blocking material, such as, but not limited to, Nblok (nitrogen-doped silicon carbide).

The memory device 100 may also include a first electrode 108 arranged within the recess 106 of the insulating layer 104. The first electrode 108 may include a base surface 108$b$ arranged along the bottom surface 106$b$ of the recess 106 and a top surface 108$t$ laterally aligned with the top surface 104$t$ of the insulating layer 104. Further, the first electrode 108 may be arranged along the opposing side walls 106$s_1$, 106$s_2$ of the recess 106. In particular, the first electrode 108 may include a first part 108$_1$ arranged along the first side wall 106$s_1$ and a second part 108$_2$ arranged along the second side wall 106$s_2$. The first and second parts 108$_1$, 108$_2$ of the first electrode 108 may be separated from each other. Accordingly, the base surface 108$b$ and the top surface 108$t$ of the first electrode 108 may each include a gap. The first electrode 108 may be an inert electrode and may include inert electrode material, such as, but not limited to, tungsten (W), ruthenium (Ru), platinum (Pt), titanium nitride (TiN), tantalum nitride (TaN), alloys thereof, or combinations thereof.

The memory device 100 may further include a switching element 110 arranged within the recess 106 of the insulating layer 104 and along the first electrode 108. The switching element 110 may include a base surface 110$b$ arranged along the bottom surface 106$b$ of the recess 106 and a top surface 110$t$ laterally aligned with the top surface 104$t$ of the insulating layer 104. In other words, the base surfaces 108$b$, 110$b$ of the first electrode 108 and the switching element 110 may be laterally aligned. Similarly, the top surfaces 108$t$, 110$t$ of the first electrode 108 and the switching element 110 may be laterally aligned. As shown in FIG. 1, the switching element 110 may include a first part 110$_1$ nearer to the first side wall 106$s_1$ of the recess 106 and a second part 110$_2$ nearer to the second side wall 106$s_2$ of the recess 106. The first part 110$_1$ of the switching element 110 may be arranged along the first part 108$_1$ of the first electrode 108 and the second part 110$_2$ of the switching element 110 may be arranged along the second part 108$_2$ of the first electrode 108. The first and second parts 110$_1$, 110$_2$ of the switching element 110 may similarly be separated from each other. Accordingly, the base surface 110$b$ and the top surface 110$t$ of the switching element 110 may each include a gap. The switching element 110 may include switching material, such as, but not limited to, magnesium oxide (MgO), tantalum oxide (TaO$_x$), hafnium oxide (HfO$_x$), titanium oxide (TiO$_x$), aluminum oxide (AlO$_x$), silicon dioxide (SiO$_x$), strontium oxide (SrO$_x$), lanthanide oxide or combinations thereof.

The memory device 100 may further include a second electrode 112 arranged within the recess 106 of the insulating layer 104 and along the switching element 110. In particular, referring to FIG. 1, the second electrode 112 may include a liner arranged along the switching element 110, where the ends 112$e$ of the liner may be laterally aligned with the top surfaces 108$t$, 110$t$ of the first electrode 108 and the switching element 110. The liner may also extend into and across the first blocking layer 150 between the first and second parts 110$_1$, 110$_2$ of the switching element 110. The liner may be thin with its thickness ranging from about 5 nm to about 15 nm. This may help to reduce the amount of electrode material used for fabricating the memory device 100, and hence, the cost of this fabrication. The second electrode 112 may be an active electrode and may include active electrode material such as, but not limited to, tantalum (Ta), tantalum nitride (TaN), hafnium (Hf), titanium (Ti), titanium nitride (TiN), platinum (Pt), copper (Cu), silver (Ag), cobalt (Co), tungsten (W), alloys thereof, or combinations thereof.

The memory device 100 may further include a conductive member 114 arranged at least partially within the recess 106, where the conductive member 114 may adjoin the second electrode 112. As shown in FIG. 1, the conductive member 114 may include a conductive layer 116 and a conductive region 118. The conductive layer 116 may be arranged along an entire length of the second electrode 112, and the conductive region 118 may be arranged over the conductive layer 116 to fill the remaining portion of the recess 106. In FIG. 1, the conductive member 114 is depicted as being partially within the recess 106 with a portion of the conductive layer 116 extending into the first blocking layer 150, but the conductive member 114 may alternatively be entirely within the recess 106. The conductive layer 116 and the conductive region 118 may each include conductive material such as, but not limited to, aluminum, tungsten, tantalum, tantalum nitride, titanium, titanium nitride, cobalt, alloys thereof, or combinations thereof. For example, the conductive layer 116 may include tantalum, tantalum nitride or cobalt, and the conductive region 118 may include copper. Alternatively, the conductive layer 116 may include titanium or titanium nitride, and the conductive region 118 may include tungsten. In FIG. 1, the conductive layer 116 and the conductive region 118 are shown as including different materials, but in alternative non-limiting embodiments, the conductive layer 116 and the conductive region 118 may include a same material.

The memory device 100 may also include a capping layer 120 arranged over the recess 106 of the insulating layer 104. As shown in FIG. 1, the capping layer 120 may extend continuously over the recess 106. The capping layer 120 may at least partially overlap the first electrode 108, the switching element 110 and the second electrode 112. In particular, referring to FIG. 1, the capping layer 120 may extend laterally across an entire width $W_{106}$ of the recess 106. Accordingly, the capping layer 120 may overlap the entire top surfaces 108t, 110t of the first electrode 108 and the switching element 110 and the ends 112e of the second electrode 112, and may also overlap the conductive member 114. The capping layer 120 may include an oxide layer, where the oxide layer may include an oxide of a material of at least one of the first electrode 108 and the second electrode 112. For example, if the first electrode 108 includes titanium nitride and the second electrode 112 includes tantalum, the oxide layer may include at least one of titanium oxy-nitride and tantalum oxide. The oxide layer may further include an oxide of a material of the switching element 110, an oxide of a material of the conductive layer 116, an oxide of a material of the conductive region 118 or a combination thereof. A thickness $T_{120}$ of the capping layer 120 may be greater than or equal to 1 nm. For example, the thickness $T_{120}$ of the capping layer 120 may range from about 1 nm to about 15 nm.

As shown in FIG. 1, the memory device 100 may also include a further insulating layer 122 arranged above the insulating layer 104. The further insulating layer 122 may be an inter-layer dielectric (ILD) layer and may include insulating material, such as, but not limited to, silicon oxide, silicon dioxide, silicon nitride, or combinations thereof. The further insulating layer 122, the insulating layer 104 and the base layer 102 may include a same material, but alternatively, at least two of these layers 102, 104, 122 may include different materials.

The memory device 100 may further include an intermediate layer 124 arranged between the insulating layer 104 and the further insulating layer 122. As shown in FIG. 1, a base 124b of the intermediate layer 124 may be laterally aligned with the base 120b of the capping layer 120, and a thickness $T_{124}$ of the intermediate layer 124 may be approximately equal to the thickness $T_{120}$ of the capping layer 120. However, the thickness $T_{120}$ of the capping layer 120 may alternatively be less than the thickness $T_{124}$ of the intermediate layer 124. The intermediate layer 124 may include a second blocking layer 152 and a protective layer 154 arranged over the second blocking layer 152. A thickness $T_{154}$ of the protective layer 154 may be greater than 5 nm. For example, the thickness $T_{154}$ of the protective layer 154 may range from about 5 nm to about 15 nm. A thickness $T_{152}$ of the second blocking layer 152 may be equal to or less than a thickness $T_{150}$ of the first blocking layer 150. The second blocking layer 152 may include a blocking material, such as, but not limited to, Nblok (nitrogen-doped silicon carbide). The protective layer 154 may include an oxide layer. For example, the protective layer 154 may include an oxide of a protective material, such as, but not limited to, silicon dioxide ($SiO_2$), silicon oxynitride (SiON), or combinations thereof.

The memory device 100 may also include a plurality of contacts including a first contact 126, a second contact 128, a third contact 130, a fourth contact 132, a fifth contact 134 and a sixth contact 136. The memory device 100 may also include a plurality of connectors including a first connector 138, a second connector 140, a third connector 142 and a fourth connector 144. As shown in FIG. 1, the first contact 126 and the second contact 128 may be arranged within the base layer 102 and may be electrically isolated from each other by part of the base layer 102. The first contact 126 may contact the second electrode 112; whereas, the second contact 128 may be electrically connected to the third contact 130 by the first connector 138. In particular, the third contact 130 may be arranged within the insulating layer 104 and the first connector 138 may extend from the third contact 130 to the second contact 128, through the insulating layer 104 and the first blocking layer 150. The third contact 130 may in turn be connected to the fourth contact 132 by the second connector 140, where the second connector 140 may extend between the third and fourth contacts 130, 132 through the further insulating layer 122, the protective layer 154 and the second blocking layer 152. In addition, as shown in FIG. 1, the fifth contact 134 may be electrically connected to the first part $108_1$ of the first electrode 108 by the third connector 142; whereas, the sixth contact 136 may be electrically connected to the second part $108_2$ of the first electrode 108 by the fourth connector 144. The fifth and sixth contacts 134, 136 may be arranged within the further insulating layer 122 and the third and fourth connectors 142, 144 may extend through the further insulating layer 122, the protective layer 154 and the second blocking layer 152 into the insulating layer 104.

As mentioned above, a first blocking layer 150 may be arranged between the insulating layer 104 and the base layer 102, and a second blocking layer 152 may be arranged between the further insulating layer 122 and the insulating layer 104. The first blocking layer 150 may help to reduce the amount of diffusion of conductive material from the second contact 128 into the insulating layer 104; whereas, the second blocking layer 152 may help to reduce the amount of diffusion of conductive material from the third contact 130, the conductive layer 116 and the conductive region 118 into the further insulating layer 122. The first and second blocking layers 150, 152 may be optional. For example, the first blocking layer 150 may be omitted and the second electrode 112 may extend along the bottom surface 106b of the recess 106.

FIGS. 2A to 2M show simplified cross-sectional views that illustrate a method for fabricating the memory device 100 according to various non-limiting embodiments. For clarity of illustration, some reference numerals have been omitted from FIGS. 2A to 2M.

Figure 2A:
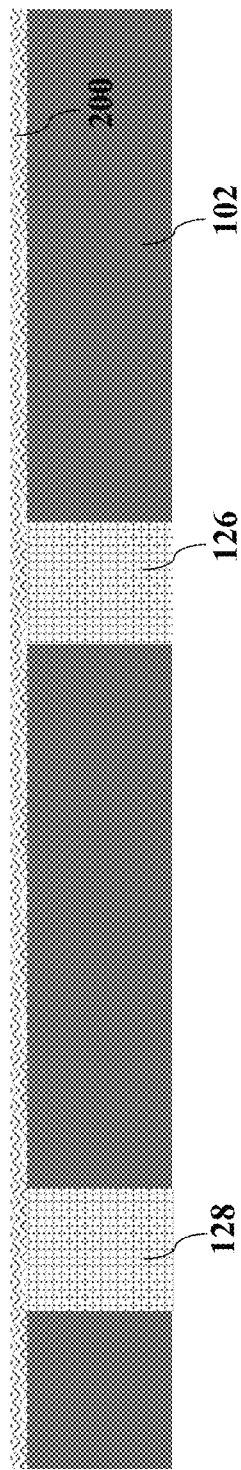
FIGS. 2A to 2M show simplified cross-sectional views that illustrate a method for fabricating the memory device of FIG. 1 according to various non-limiting embodiments.

Referring to FIG. 2A, the method may include providing the base layer 102, and forming the first and second contacts 126, 128 within the base layer 102. For example, insulating material may first be deposited over a surface on which the memory device 100 is to be formed and then etched to form openings. The openings may subsequently be filled with conductive material to form the contacts 126, 128 within the base layer 102. The method may further include depositing first blocking material 200 over the base layer 102.

Figure 2B:
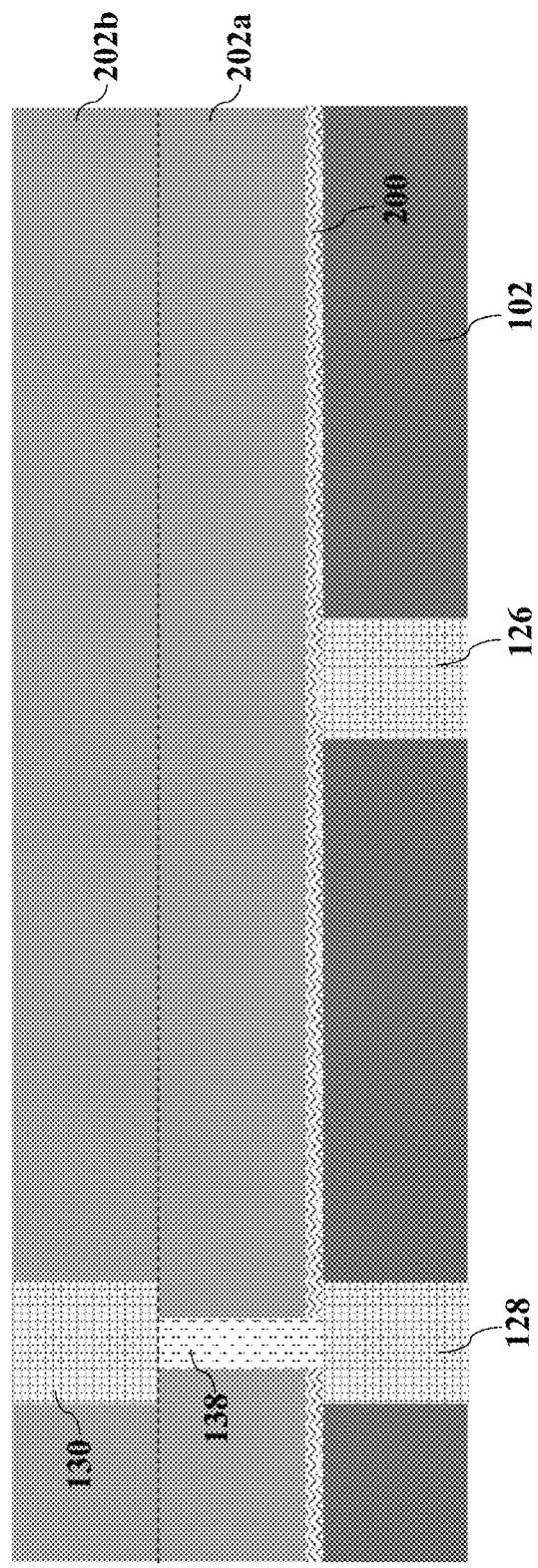
Figure 2C:
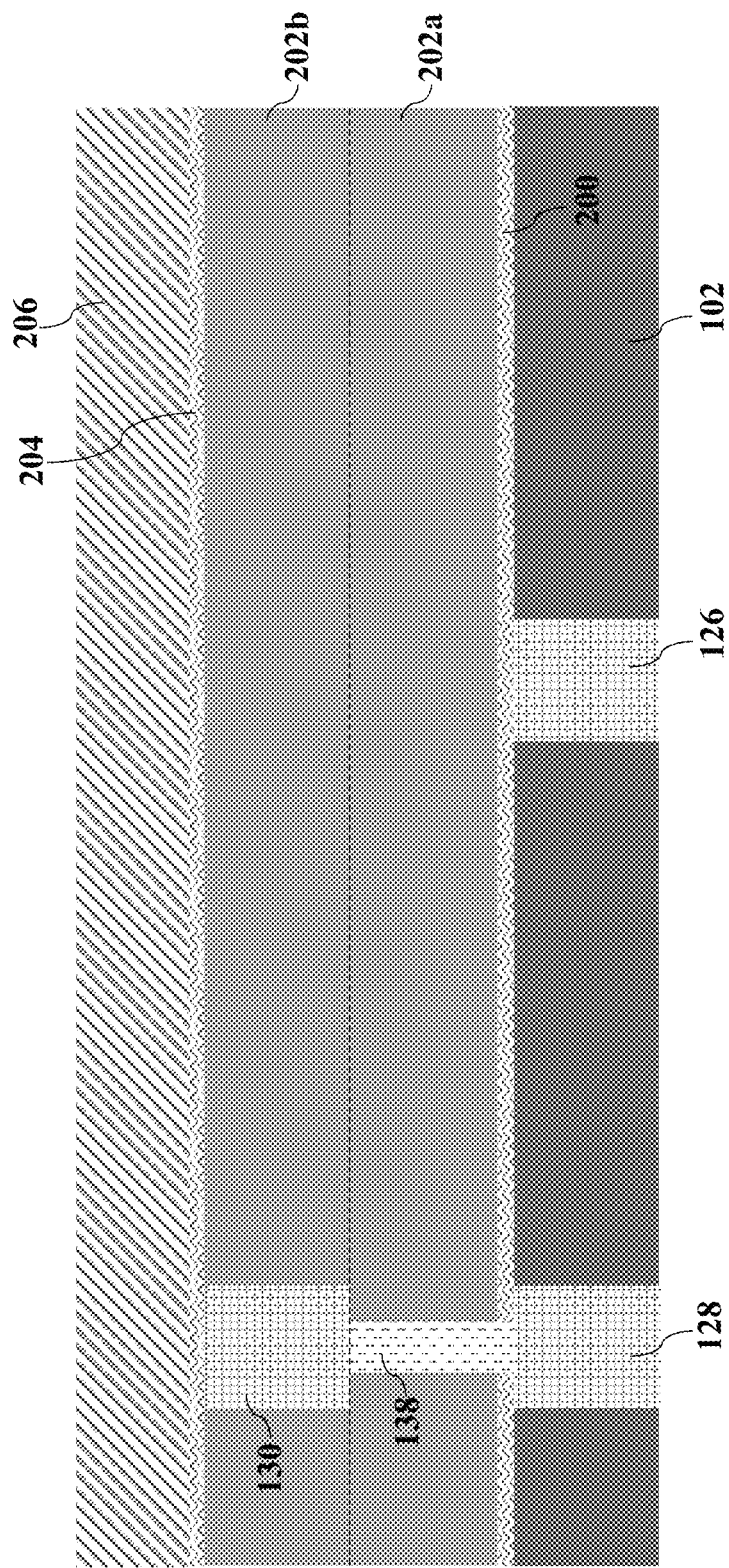
Figure 2D:
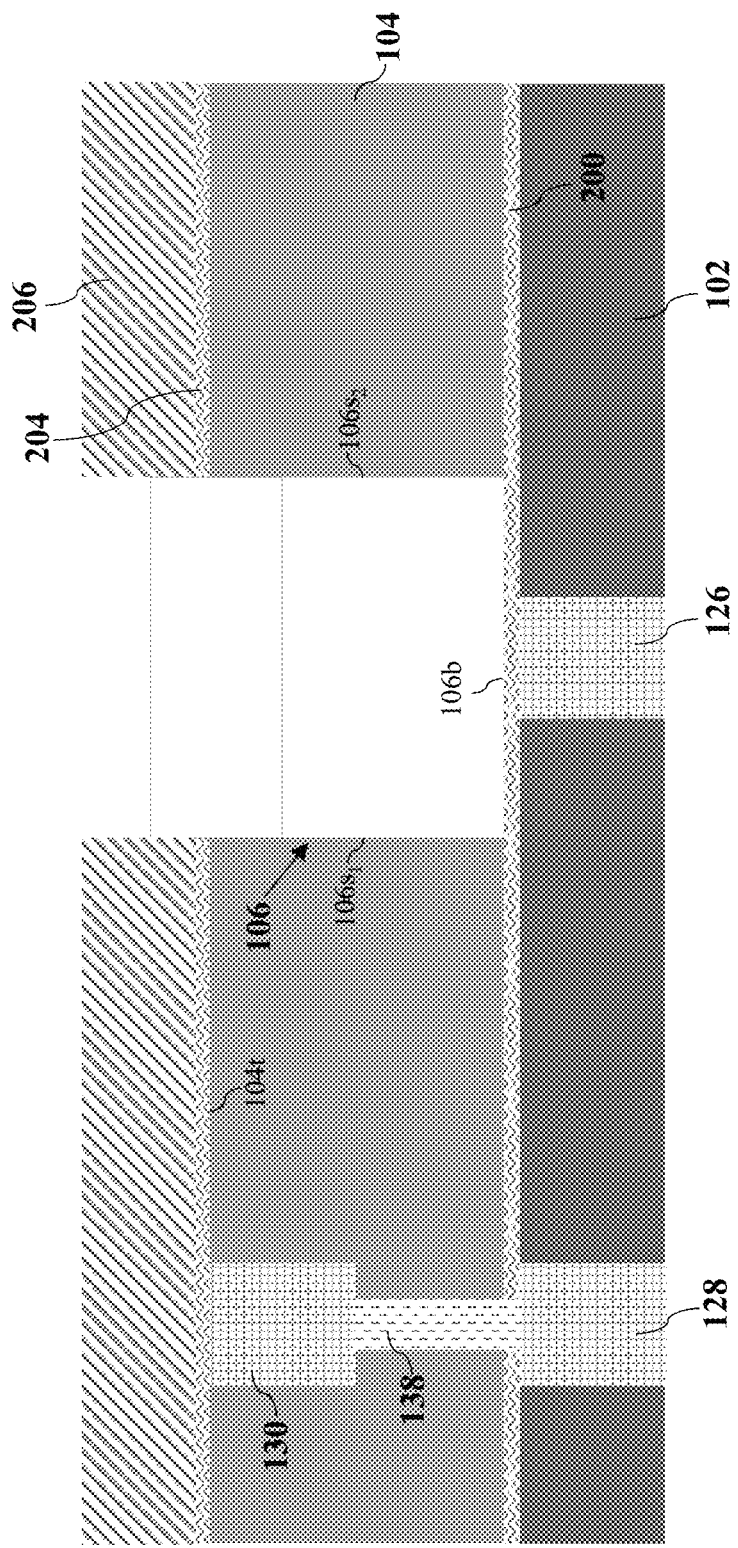

Referring to FIGS. 2B, 2C and 2D, the method may further include forming the insulating layer 104. As shown in FIG. 2B, insulating material may be deposited over the base layer 102, in particular, over the first blocking material 200. In particular, first insulating material 202a may be deposited and may then be etched, together with the first blocking material 200 to form an opening. Thereafter, conductive material may be deposited into the opening to form the first connector 138. Second insulating material 202b may then be deposited over the first insulating material 202a and subsequently etched to form an opening. Conductive material may then be deposited into this opening to form the third contact 130. As shown in FIG. 2C, the method may further include depositing second blocking material 204 and protective material 206 over the second insulating material 202b, with the protective material 206 arranged over the second blocking material 204. As shown in FIG. 2D, the method may further include etching the first and second insulating materials 202a, 202b, the second blocking material 204 and the protective material 206. The insulating layer 104 having the recess 106 may thus be formed over the base layer 102 (in particular, over the first blocking material 200), with the second blocking material 204 and the protective material 206 thereabove.

Figure 2E:
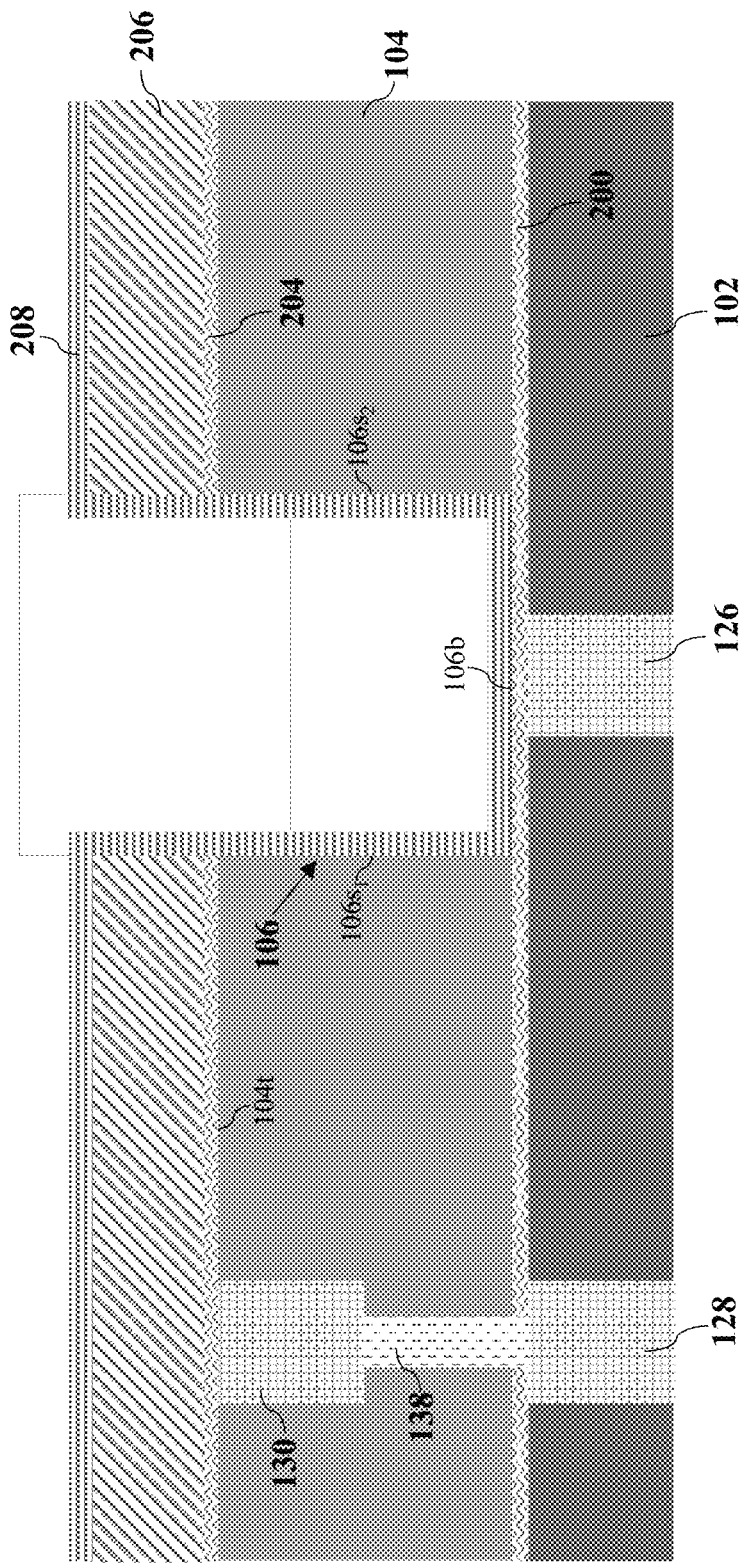

Referring to FIG. 2E, the method may further include depositing electrode material 208 over the insulating layer 104 (in particular, over the protective material 206) and into the recess 106, such that the electrode material 208 may line the side walls $106s_1$, $106s_2$ and the bottom surface $106b$ of the recess 106.

Figure 2F:
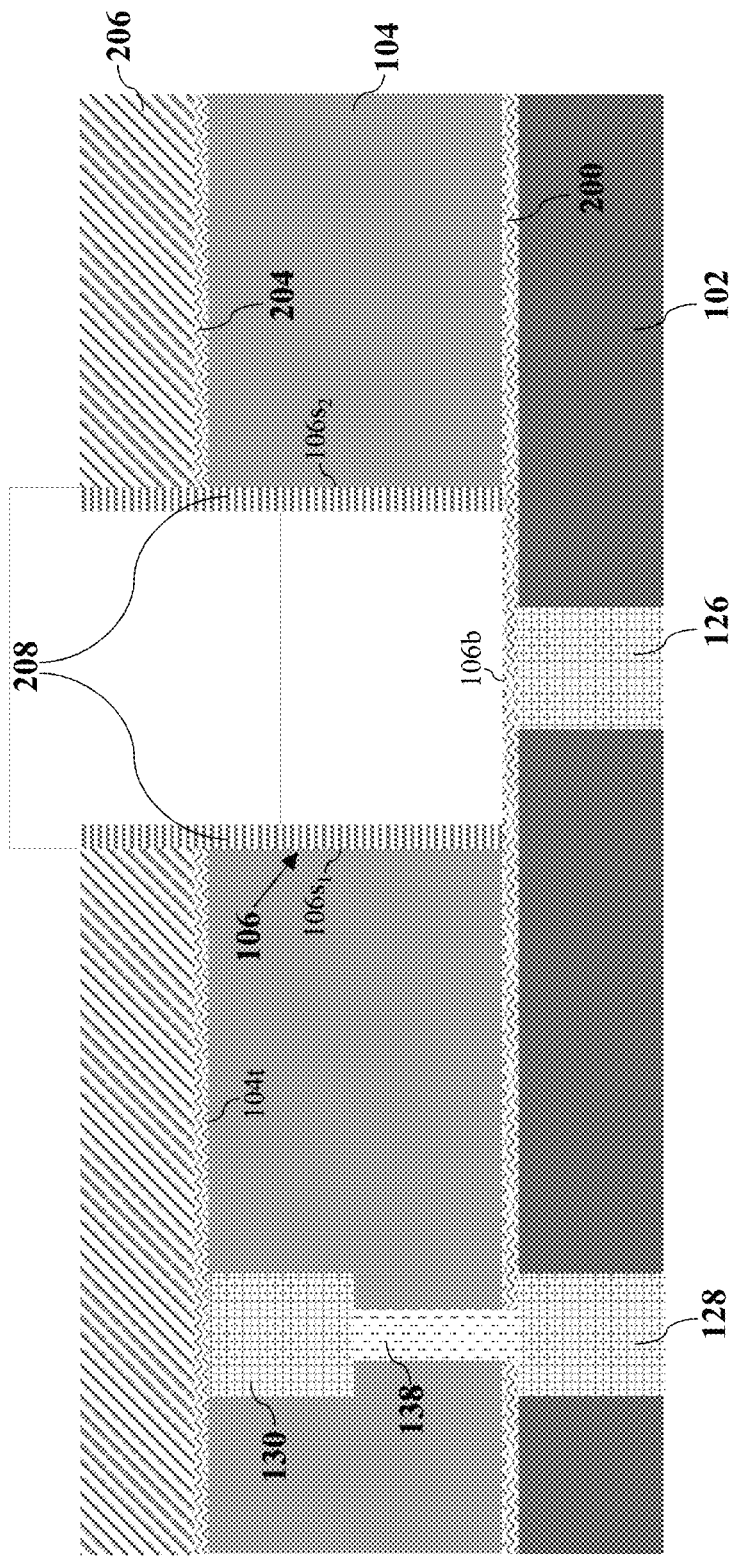

Referring to FIG. 2F, the method may further include removing a part of the electrode material 208 over the protective material 206 and along the bottom surface $106b$ of the recess 106. This may be done using an etching process, such as, but not limited to, a spacer etch process.

Figure 2G:
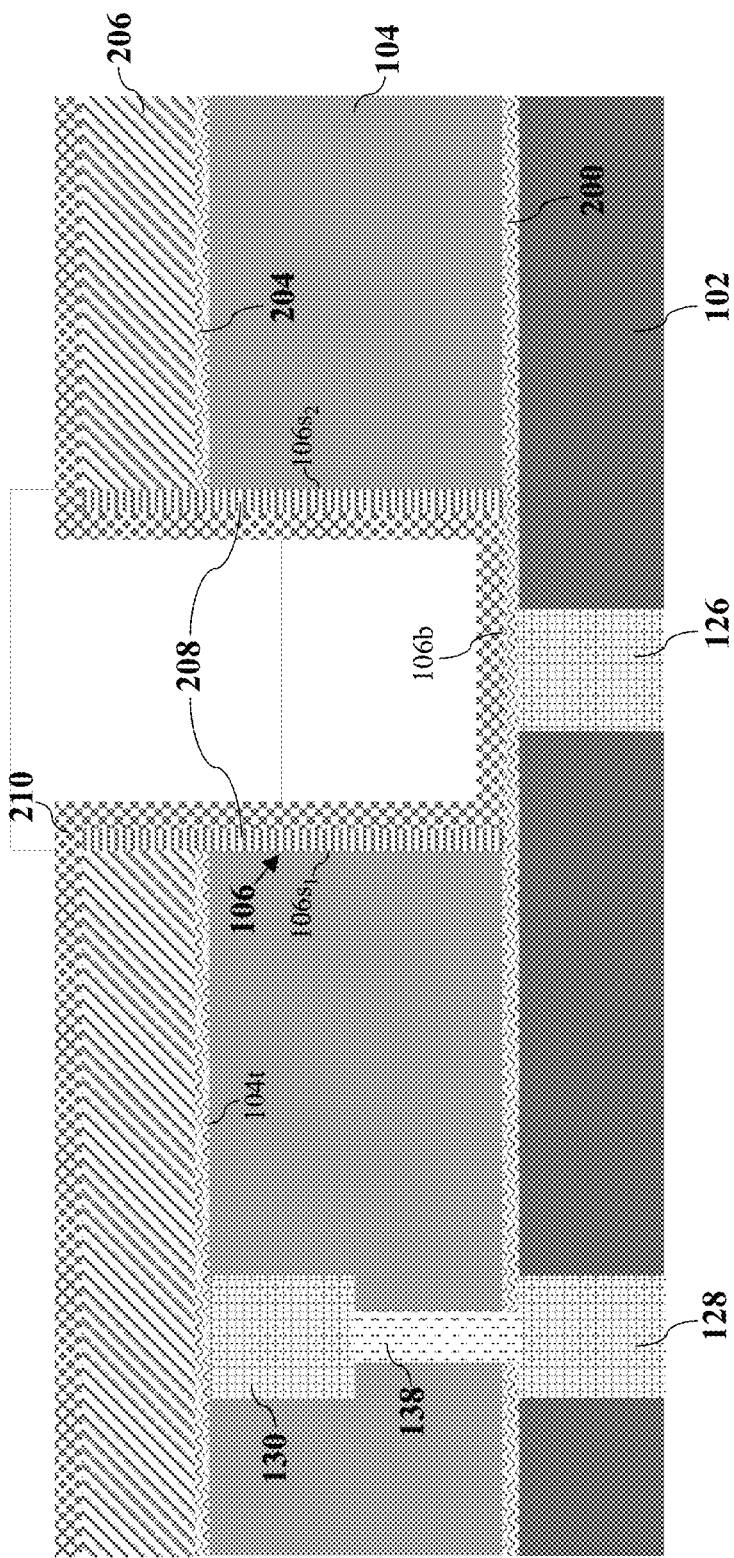

Referring to FIG. 2G, the method may further include depositing switching material 210 over the protective material 206 and into the recess 106, such that the switching material 210 may line the electrode material 208 and the bottom surface $106b$ of the recess 106.

Figure 2H:
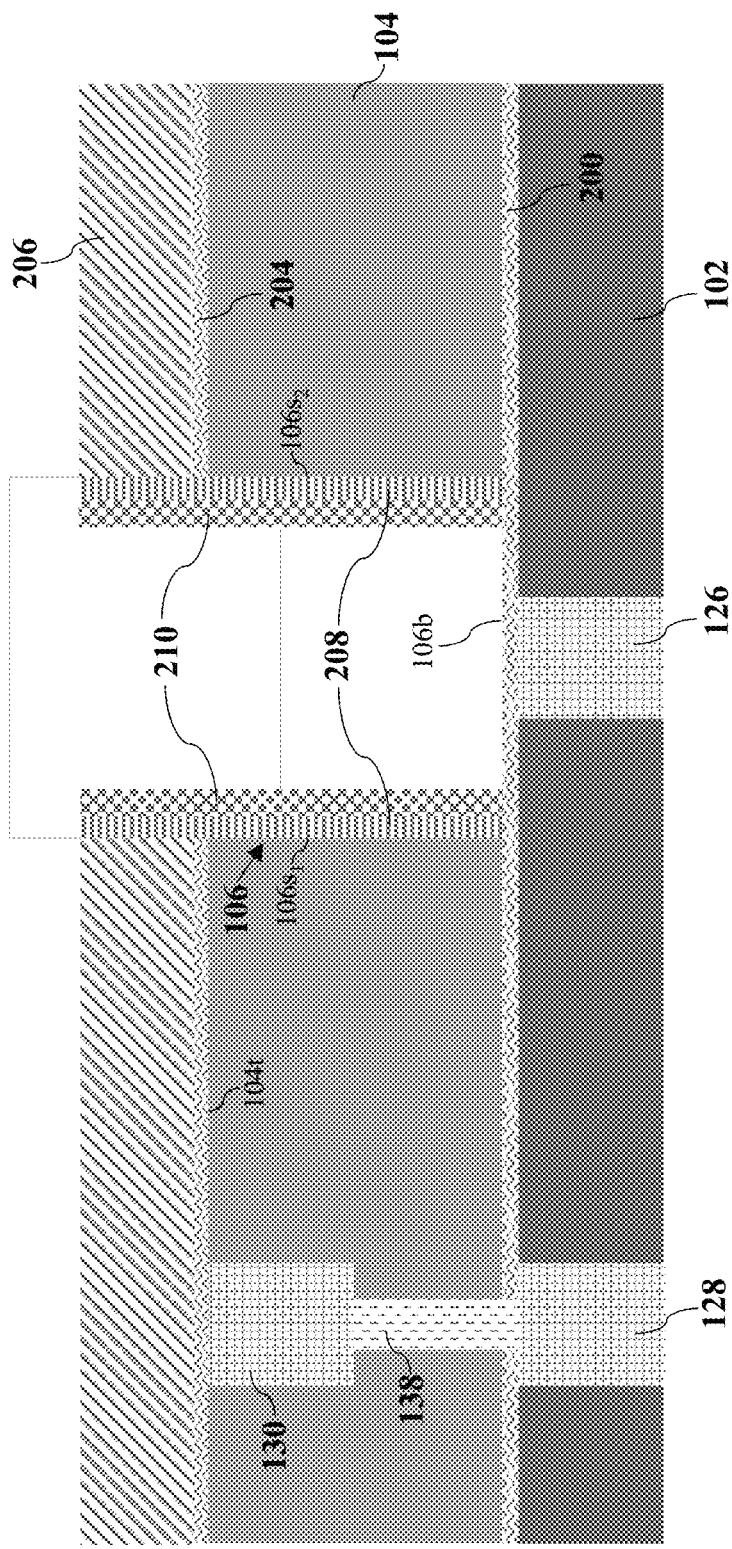

Referring to FIG. 2H, the method may further include removing a part of the switching material 210 over the protective material 206 and along the bottom surface $106b$ of the recess 106. This may be done using an etching process, such as, but not limited to, a spacer etch process.

Figure 2I:
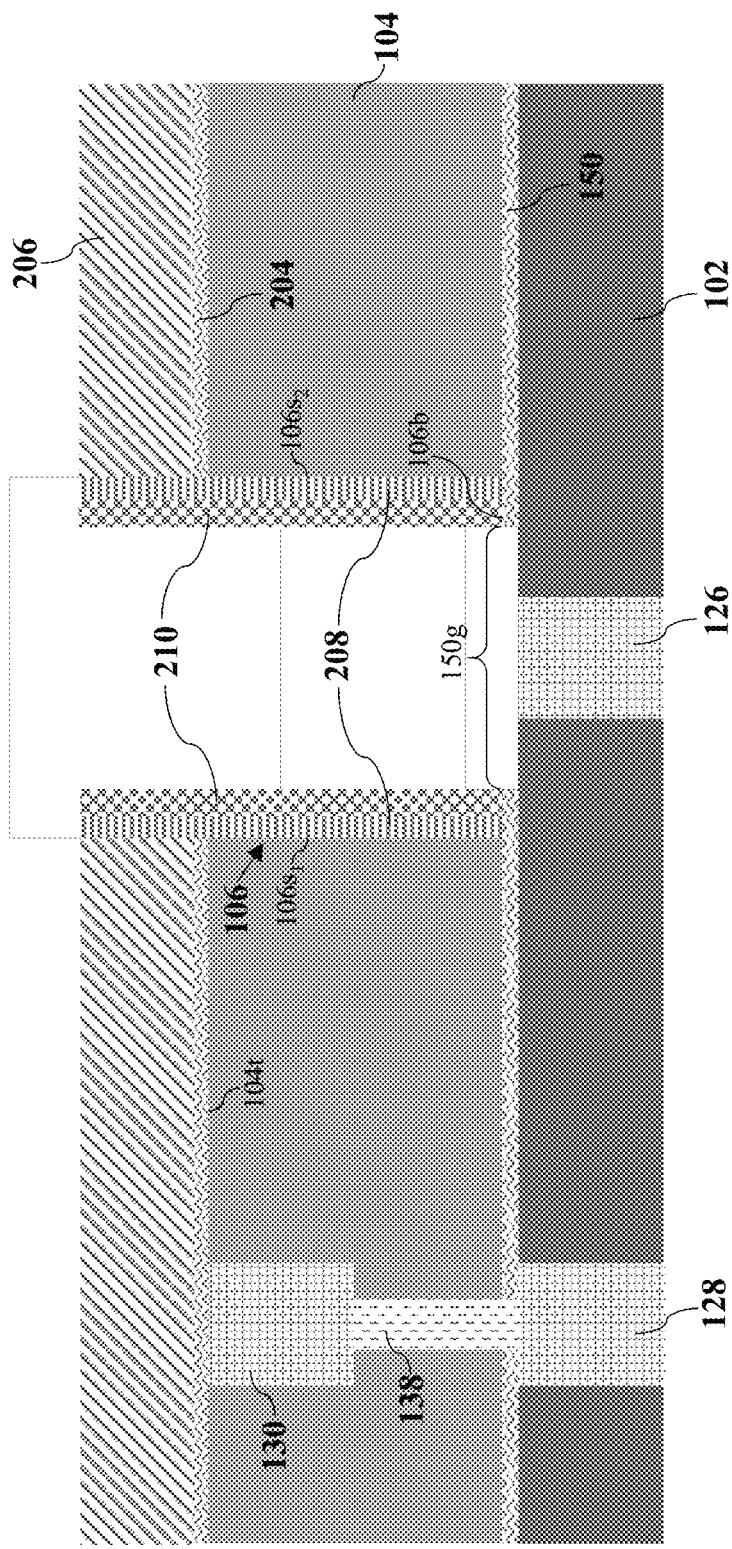

Referring to FIG. 2I, the method may further include etching the first blocking material 200 to form the first blocking layer 150 with a gap 150g vertically aligned with the recess 106. For clarity of illustration, the gap 150g is not labelled in the other figures.

Figure 2J:
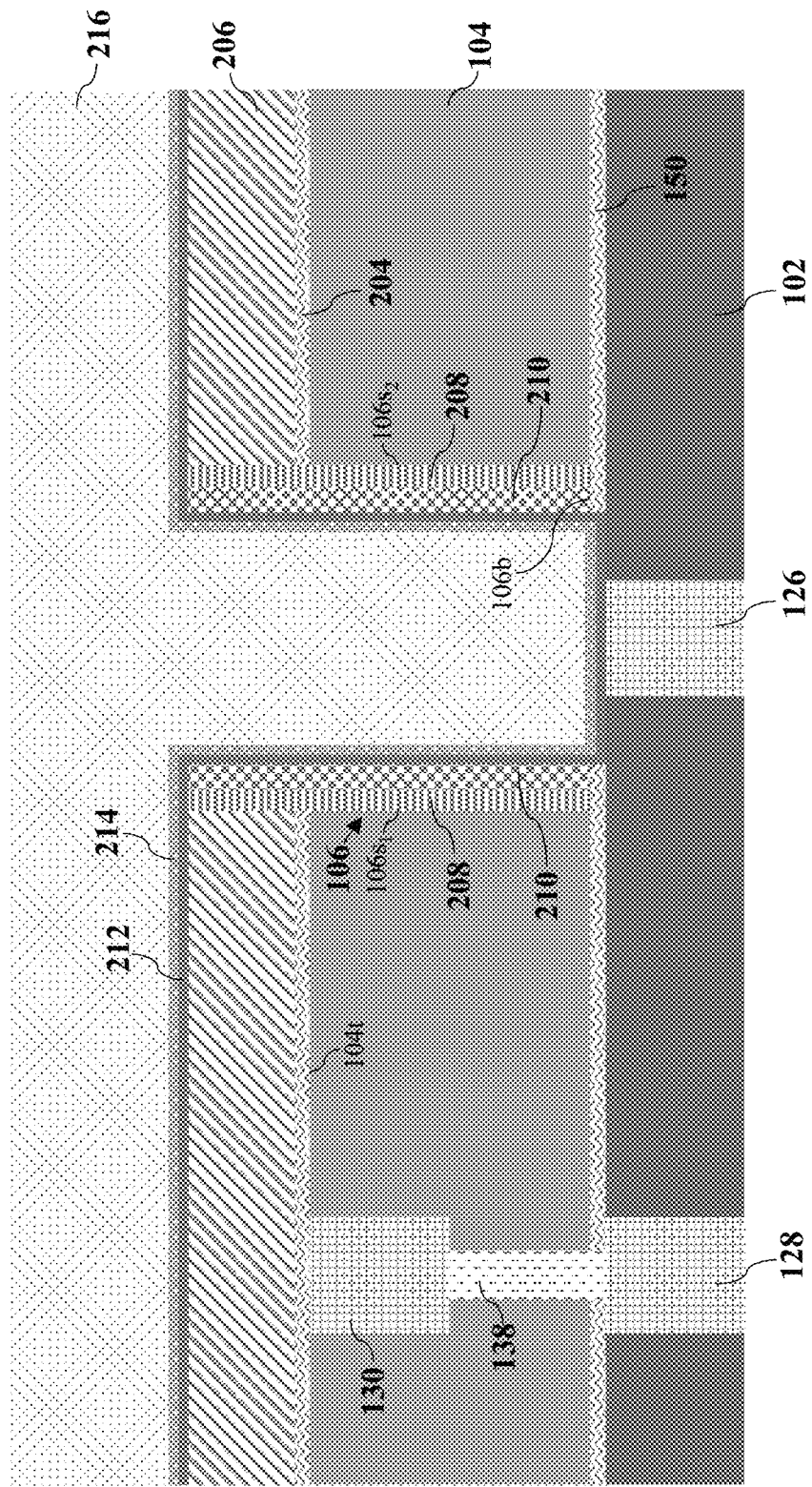

Referring to FIG. 2J, the method may further include depositing an electrode liner 212 over the protective material 206 and into the recess 106 such that the electrode liner 212 may line the switching material 210. As shown in FIG. 2J, the electrode liner 212 may extend into and across the first blocking layer 150 (in particular, the gap 150g of the first blocking layer 150). The method may also include depositing a conductive liner 214 such that the conductive liner 214 may line the electrode liner 212. In addition, the method may include depositing conductive material 216 over the conductive liner 214 and into the recess 106, such that the conductive material 216 may fill the remaining part of the recess 106.

Figure 2K:
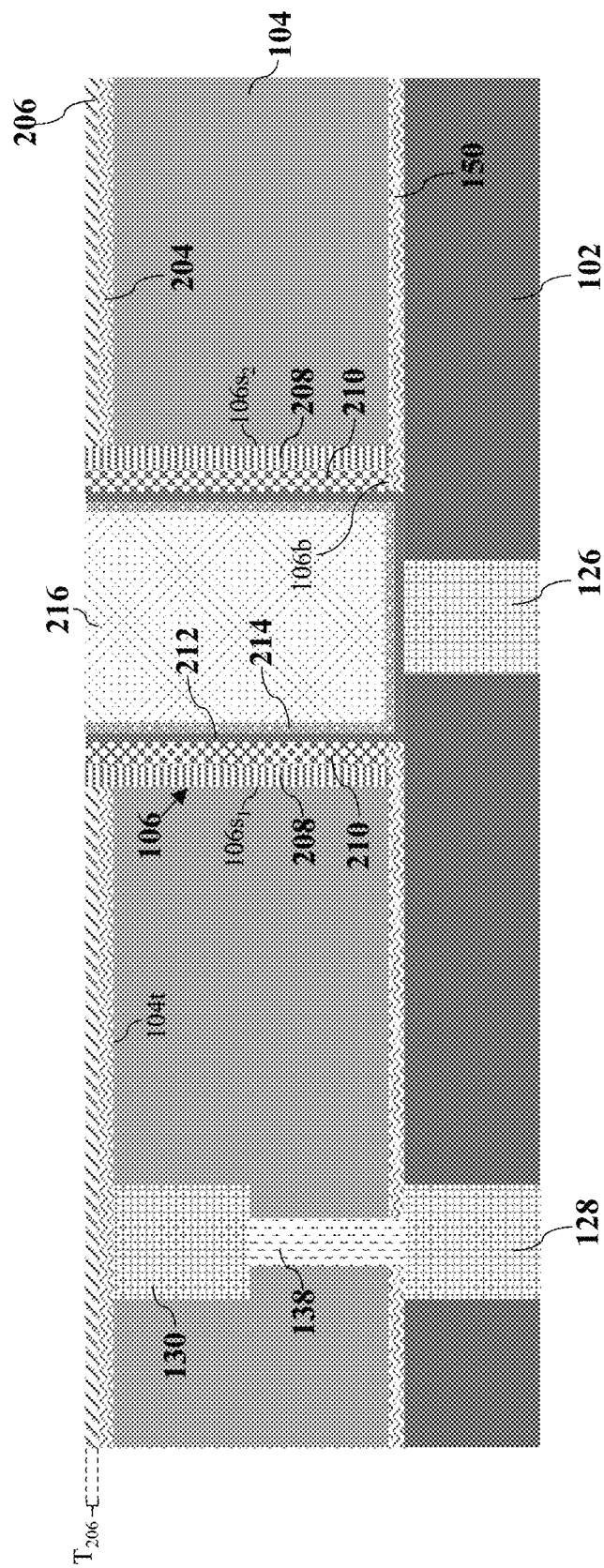

Referring to FIG. 2K, the method may further include removing an upper portion of each of the conductive material 216, the conductive liner 214, the electrode liner 212, the protective material 206, the switching material 210 and the electrode material 208. This may be done using a planarization process, such as, but not limited to, a chemical mechanical polishing (CMP) process. As shown in FIG. 2K, a portion of the protective material 206 above the second blocking material 204 may remain. A thickness $T_{206}$ of this remaining portion of the protective material 206 may be greater than 5 nm. For example, a thickness $T_{206}$ of this remaining portion of the protection material 206 may range from about 5 nm to about 15 nm.

Figure 2L:
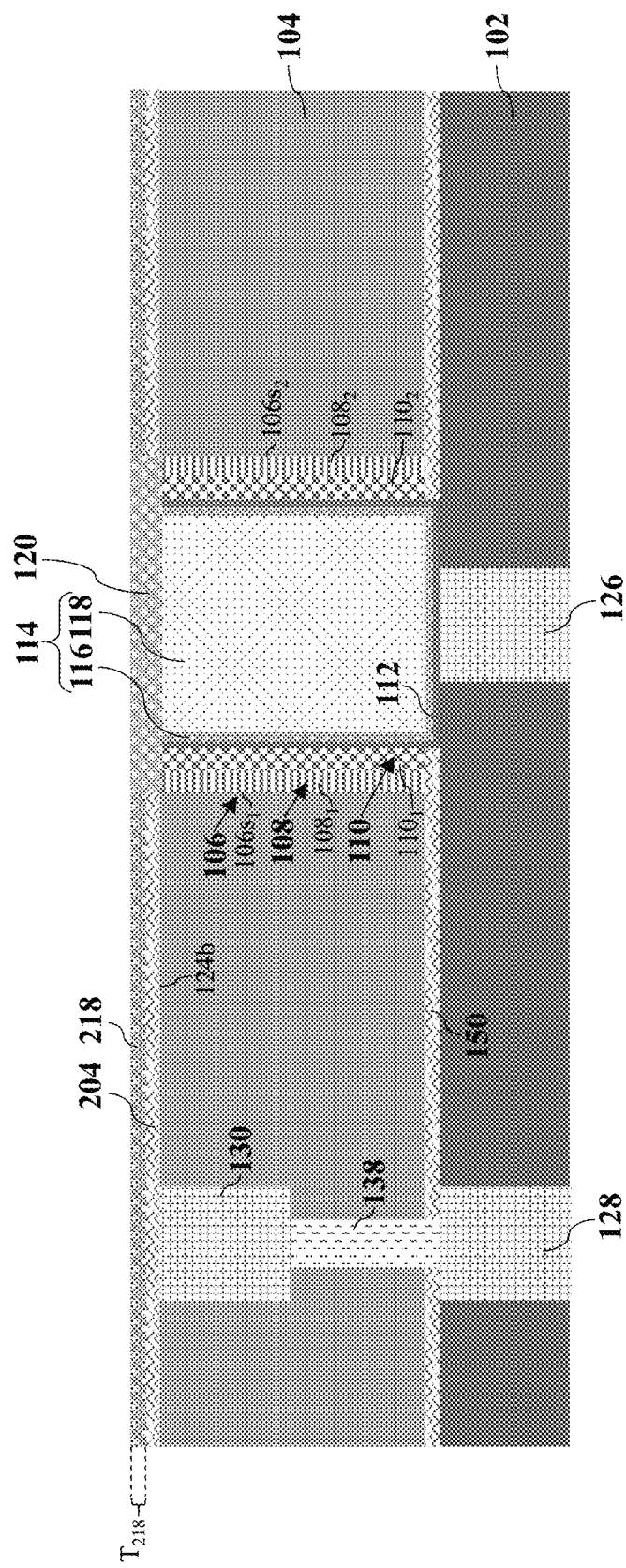

Referring to FIG. 2L, the method may further include forming the capping layer 120, the first electrode 108, the switching element 110, the second electrode 112, the conductive layer 116 and the conductive region 118 with a single oxidisation process. In particular, the method may include forming the capping layer 120 over the recess 106 by oxidising a top part of each of the conductive material 216, the conductive liner 214, the electrode liner 212, the switching material 210 and the electrode material 208 extending above the recess 106. The oxidised parts of these materials 208, 210, 212, 214, 216 may form the capping layer 120; whereas, the remaining parts of these materials 208, 210, 212, 214, 216 may form the first electrode 108, the switching element 110, the second electrode 112, the conductive layer 116 and the conductive region 118, respectively. The oxidising of the top part of each of the materials 208, 210, 212, 214, 216 may further oxidise the protective material 206 to form oxidised protective material 218. A thickness $T_{218}$ of the oxidised protective material 218 may be equal to the thickness $T_{206}$ as mentioned above. Alternatively, the thickness $T_{218}$ may be greater than the thickness $T_{206}$ as the oxidisation process may convert a top portion of the second blocking material 204 to become a part of the oxidised protective material 218. In this case, the resulting second blocking layer 152 may have a thickness $T_{152}$ less than a thickness $T_{150}$ of the first blocking layer 150.

Figure 2M:
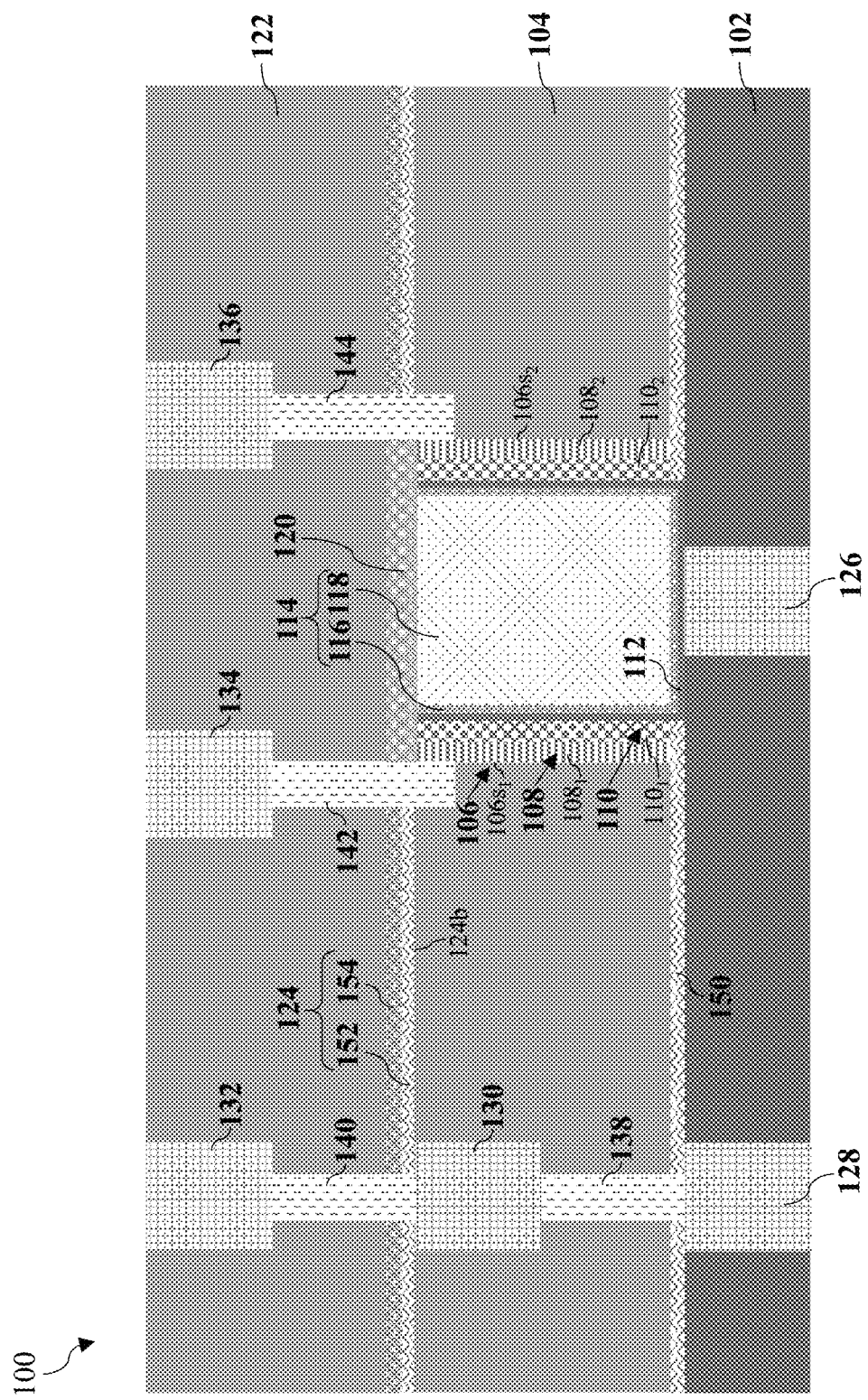

Referring to FIG. 2M, the method may further include depositing third insulating material over the oxidised protective material 218. The method may also include etching the third insulating material, the oxidised protective material 218, the second blocking material 204 and the insulating layer 104 to form openings. These openings may then be filled with conductive material to form the second, third and fourth connectors 140, 142, 144. The remaining oxidised protective material 218 and the remaining second blocking material 204 may form the protective layer 154 and the second blocking layer 152, respectively. The method may also include depositing fourth insulating material over the third insulating material, and etching the fourth insulating material to form openings. These openings may then be filled with conductive material to form the fourth, fifth and sixth contacts 132, 134, 136. The remaining third and fourth insulating material may then form the further insulating layer 122.

The above described order for the method is only intended to be illustrative, and the method is not limited to the above specifically described order unless otherwise specifically stated.

In use, when a sufficiently high potential difference is applied between the first part $108_1$ of the first electrode 108 and the second electrode 112 (e.g. using the first and fifth contacts 126, 134), conducting filaments may be formed therebetween within the first part $110_1$ of the switching element 110. Similarly, when a sufficiently high potential difference is applied between the second part $108_2$ of the first electrode 108 and the second electrode 112 (e.g. using the first and sixth contacts 126, 136), conducting filaments may be formed therebetween within the second part $110_2$ of the switching element 110. The formation of the conducting filaments between the first part $108_1$ of the first electrode 108 and the second electrode 112 may be independent from the formation of the conducting filaments between the second part $108_2$ of the first electrode 108 and the second electrode 112. The memory device 100 may thus function as a two-bit memory device.

The process (for example, CMP process) for removing the upper portion of each of the materials 208, 210, 212 as described with reference to FIG. 2K may damage a top part of one or more of these materials 208, 210, 212. Oxidising the top part of each of these materials 208, 210, 212 extending above the recess 106 may help to confine the formation of the conducting filaments to lower parts of the materials 208, 210, 212 which are less likely to be damaged. Accordingly, the performance of the memory device 100 may be improved. In addition, a portion of the protective material 206 may be retained over the second blocking material 204 prior to the oxidisation process. This retained portion of the protective material 206 may help to protect the second blocking material 204 and in turn, the contact 130 thereunder from damage during the oxidisation process.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a base layer;
   an insulating layer arranged over the base layer, wherein the insulating layer comprises a recess having opposing side walls;
   a first electrode arranged along the opposing side walls of the recess;
   a switching element arranged along the first electrode;
   a second electrode arranged along the switching element; and
   a capping layer arranged over the recess, wherein the capping layer at least partially overlaps the first electrode, the switching element and the second electrode.

2. The memory device of claim 1, wherein the capping layer extends laterally across an entire width of the recess.

3. The memory device of claim 1, wherein the capping layer extends continuously over the recess.

4. The memory device of claim 1, wherein a thickness of the capping layer is greater than or equal to 1 nm.

5. The memory device of claim 1, wherein the capping layer comprises an oxide layer.

6. The memory device of claim 5, wherein the oxide layer comprises an oxide of a material of at least one of the first electrode and the second electrode.

7. The memory device of claim 1, further comprising a conductive member arranged at least partially within the recess and adjoining the second electrode and wherein the capping layer further overlaps the conductive member.

8. The memory device of claim 1, further comprising:
   a further insulating layer arranged above the insulating layer; and
   an intermediate layer arranged between the insulating layer and the further insulating layer, wherein the intermediate layer comprises a blocking layer and a protective layer over the blocking layer.

9. The memory device of claim 8, wherein a thickness of the capping layer is approximately equal to or less than a thickness of the intermediate layer.

10. The memory device of claim 8, wherein a thickness of the protective layer is greater than 5 nm.

11. The memory device of claim 8, wherein the protective layer includes an oxide layer.

12. The memory device of claim 1, wherein the first electrode is an inert electrode and the second electrode is an active electrode.

13. The memory device of claim 1, wherein the memory device comprises a resistive random access memory device.

14. A method of forming a memory device, the method comprising:
   providing a base layer;
   forming an insulating layer over the base layer, wherein the insulating layer comprises a recess having opposing side walls;
   forming a first electrode along the opposing side walls of the recess;
   forming a switching element along the first electrode;
   forming a second electrode along the switching element; and
   forming a capping layer over the recess, wherein the capping layer at least partially overlaps the first electrode, the switching element and the second electrode.

15. The method of claim 14, wherein the capping layer, the first electrode, the switching element and the second electrode may be formed with a single oxidisation process.

16. The method of claim 14, wherein forming the capping layer, the first electrode, the switching element and the second electrode further comprises:
   depositing electrode material over the insulating layer to line the opposing side walls of the recess;
   depositing switching material to line the electrode material;
   depositing an electrode liner to line the switching material; and
   oxidising a top part of each of the electrode material, the switching material and the electrode liner extending above the recess.

17. The method of claim 16, wherein forming the insulating layer comprises depositing insulating material over the base layer and the method further comprises depositing protective material over the insulating material.

18. The method of claim 17, wherein the oxidising of the top part of each of the electrode material, the switching material and the electrode liner further oxidises the protective material.

19. The method of claim 17, wherein an upper portion of the protective material is removed prior to the oxidising process, such that a thickness of a remaining portion of the protective material is greater than 5 nm.

* * * * *